(12) United States Patent
Su et al.

(10) Patent No.: US 10,964,653 B2
(45) Date of Patent: Mar. 30, 2021

(54) METHOD OF FORMING A SEMICONDUCTOR DEVICE COMPRISING TOP CONDUCTIVE PADS

(71) Applicant: Taiwan Semiconductor Manufacturing Co., Ltd., Hsin-Chu (TW)

(72) Inventors: Ya-Ping Su, Hsin-Chu (TW); Han-Wen Fung, Hsin-Chu (TW); Chia-Chi Chung, Hsinchu (TW); Chih-Hsien Hsu, Hsinchu (TW); Chun Yan Chen, Zhubei (TW); Chien-Sheng Wu, Hsin-Chu (TW); Tien-Chih Huang, Hsin-Chu (TW); Wei-Da Chen, Hsin-Chu (TW); Chien-Hua Tseng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/003,486

(22) Filed: Jun. 8, 2018

(65) Prior Publication Data

US 2019/0096831 A1   Mar. 28, 2019

Related U.S. Application Data

(60) Provisional application No. 62/564,495, filed on Sep. 28, 2017.

(51) Int. Cl.
*H01L 23/00* (2006.01)
*H01L 21/311* (2006.01)
(Continued)

(52) U.S. Cl.
CPC ........ *H01L 24/03* (2013.01); *H01L 21/31116* (2013.01); *H01L 21/768* (2013.01); *H01L 23/522* (2013.01); *H01L 24/05* (2013.01); *H01L 2224/0219* (2013.01); *H01L 2224/0345* (2013.01); *H01L 2224/0391* (2013.01); *H01L 2224/03426* (2013.01); *H01L 2224/03452* (2013.01); *H01L 2224/03462* (2013.01); *H01L 2224/04042* (2013.01); *H01L 2224/05624* (2013.01); *H01L 2224/05639* (2013.01);
(Continued)

(58) Field of Classification Search
CPC ............... H01L 21/31116; H01L 24/03; H01L 2924/059; H01L 2224/0219; H01L 21/0276
See application file for complete search history.

(56) References Cited

U.S. PATENT DOCUMENTS

| 5,071,714 A | 12/1991 | Rodbell et al. |
| 5,269,879 A | 12/1993 | Rhoades et al. |

(Continued)

*Primary Examiner* — Stephen M Bradley
(74) *Attorney, Agent, or Firm* — Duane Morris LLP

(57) ABSTRACT

A method for making a semiconductor device is disclosed. A substrate comprising semiconductor device elements is provided. A top conductive pad and an anti-reflective coating are patterned over the substrate. The anti-reflective coating is disposed on the top conductive pad. At least one passivation film is formed over the substrate and the anti-reflective coating. The at least one passivation film and the anti-reflective coating are etched to form a trench therein so as to expose a portion of the top conductive pad.

19 Claims, 10 Drawing Sheets

(51) Int. Cl.
*H01L 21/768* (2006.01)
*H01L 23/522* (2006.01)

(52) U.S. Cl.
CPC ............... *H01L 2224/05644* (2013.01); *H01L 2224/05647* (2013.01); *H01L 2224/05684* (2013.01); *H01L 2924/00014* (2013.01); *H01L 2924/059* (2013.01)

(56) References Cited

U.S. PATENT DOCUMENTS

| | | | |
|---|---|---|---|
| 5,582,881 A | 12/1996 | Besser et al. | |
| 6,010,968 A * | 1/2000 | Yang | H01L 21/31116 257/E21.252 |
| 6,287,959 B1 * | 9/2001 | Lyons | H01L 21/0276 438/636 |
| 6,905,968 B2 * | 6/2005 | Hsieh | H01L 21/31116 438/706 |
| 7,001,848 B1 * | 2/2006 | Smith | G03F 7/427 257/E21.256 |
| 2005/0048755 A1 * | 3/2005 | Roche | H01L 21/32134 438/612 |
| 2008/0173904 A1 * | 7/2008 | Liu | H01L 27/14636 257/233 |
| 2009/0181542 A1 * | 7/2009 | Lo | H01L 21/02063 438/700 |
| 2011/0209899 A1 * | 9/2011 | Hill | H05K 3/4007 174/126.1 |
| 2014/0116760 A1 * | 5/2014 | Wang | H01L 23/3192 174/257 |

* cited by examiner

METHOD OF FORMING A SEMICONDUCTOR DEVICE COMPRISING TOP CONDUCTIVE PADS

PRIORITY CLAIM AND CROSS-REFERENCE

This application claims the benefit of U.S. Provisional Application No. 62/564,495, filed Sep. 28, 2017, which application is expressly incorporated by reference herein in its entirety.

BACKGROUND

As complementary metal oxide semiconductor (CMOS) devices are scaled to smaller sizes, new materials and concepts are being considered to meet advanced performance targets. CMOS technology includes N-type metal oxide semiconductor (NMOS) and P-type metal oxide semiconductor (PMOS). For example, a metal-oxide-semiconductor field-effect transistor (MOSFET) is a transistor used for amplifying or switching electronic signals. One aspect of high performance in NMOS and PMOS MOSFETS, and various other devices, is device switching frequency. Contacts are coupled to the gate electrodes, and to both the source and drain regions, of the transistors. A semiconductor device may have multilayer structures having multilayer wirings for increasing a density of each chip and increasing an operation speed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

Figure 1:
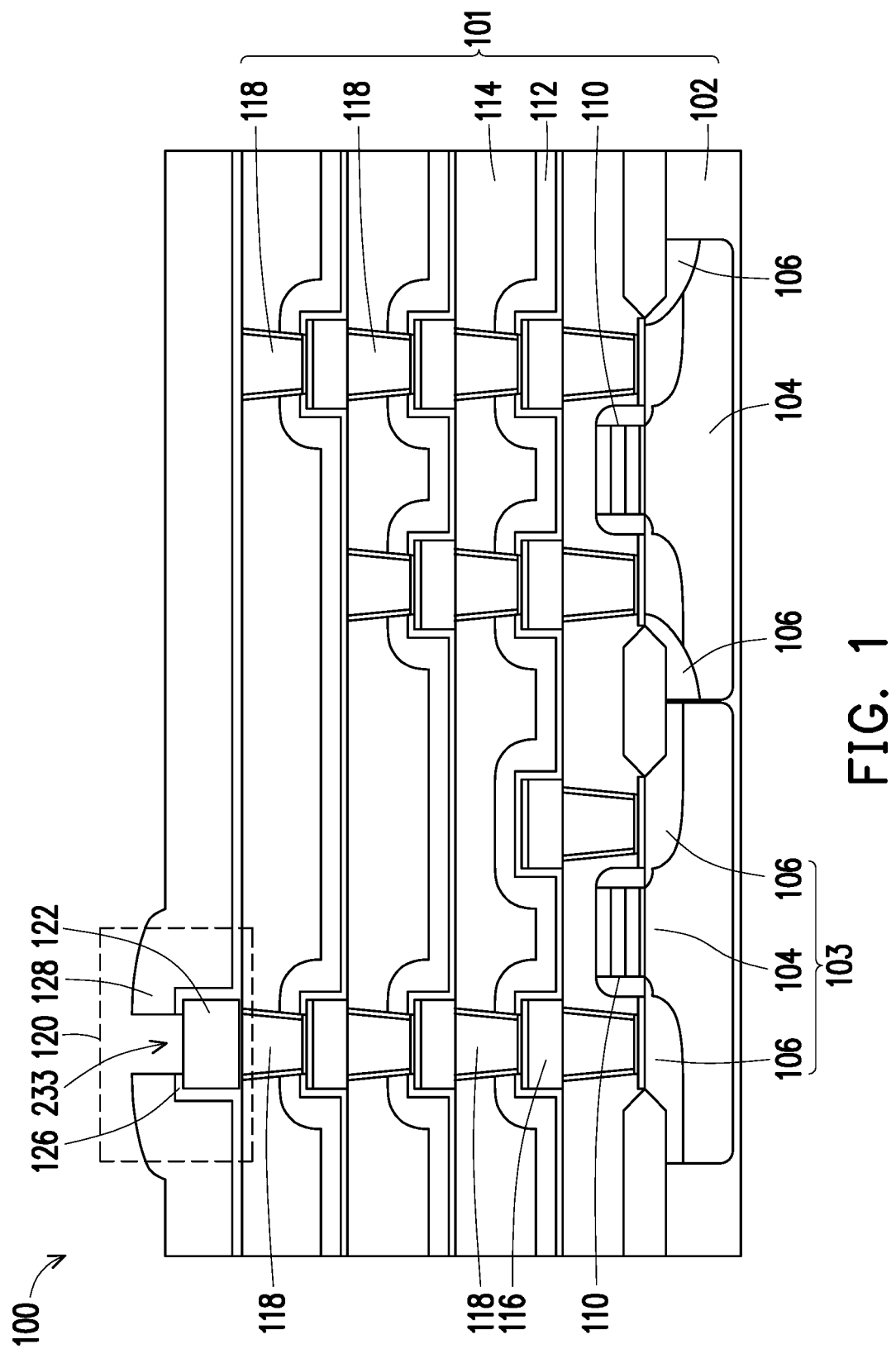
FIG. 1 is a cross-sectional view of a device comprising top conductive pads in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a top conductive pad" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

The present disclosure provides a method for manufacturing a semiconductor device. Such a semiconductor device comprises a substrate having device elements, and a top conductive pad (e.g., an uppermost metal pad) over the substrate. The method is used to make a portion of the semiconductor device comprising the top conductive pad, which is subsequently used for wire bonding or other packaging processes.

Figure 2:
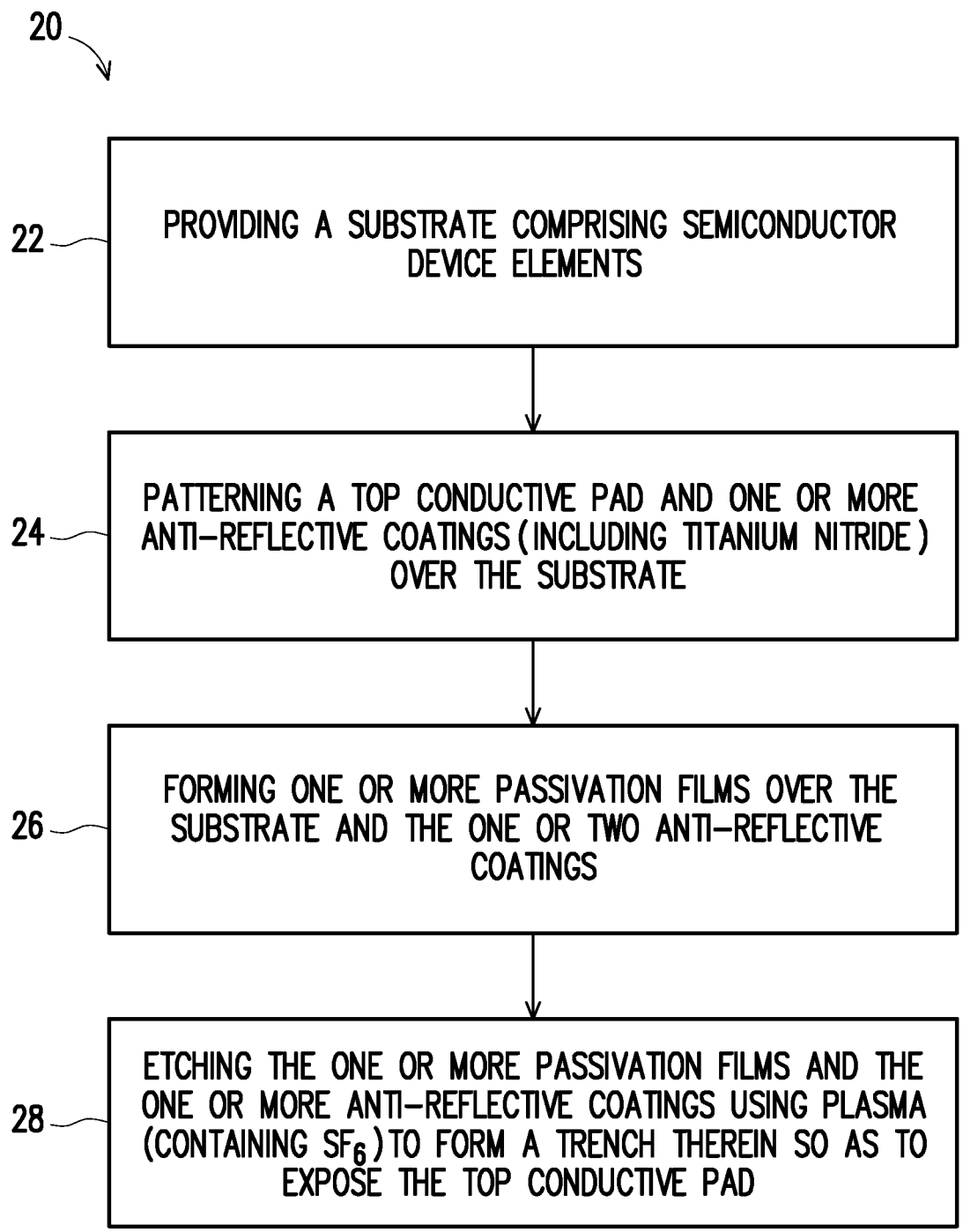
FIG. 2 is a flow chart illustrating a method for forming a semiconductor device comprising a top conductive pad in accordance with some embodiments.
Figure 3B:
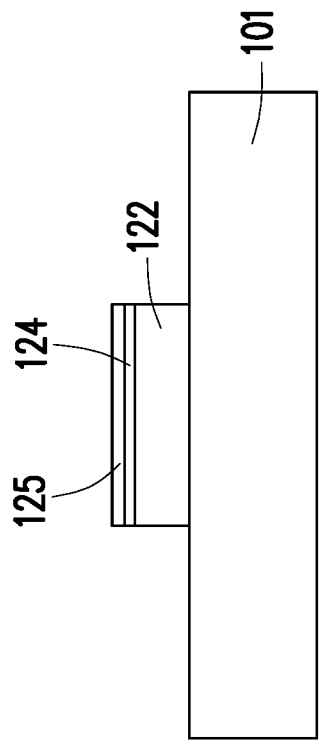
FIGS. 3A-3E are cross-sectional views of a portion of a device during fabrication in accordance with some embodiments.
Figure 3A:
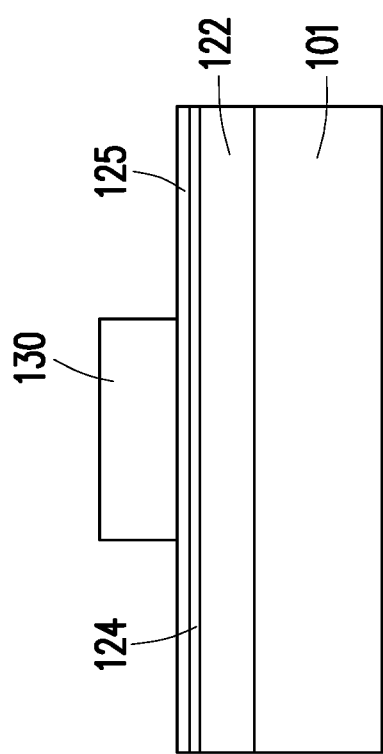
Figure 3D:
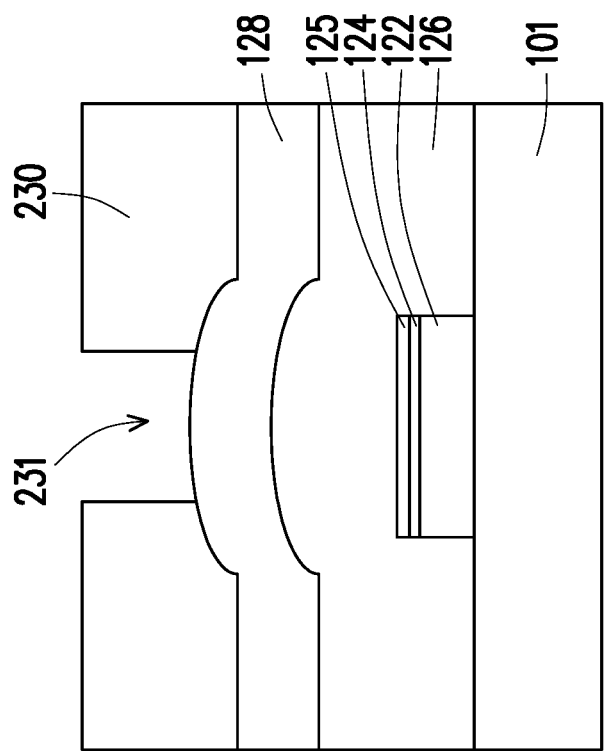
Figure 3C:
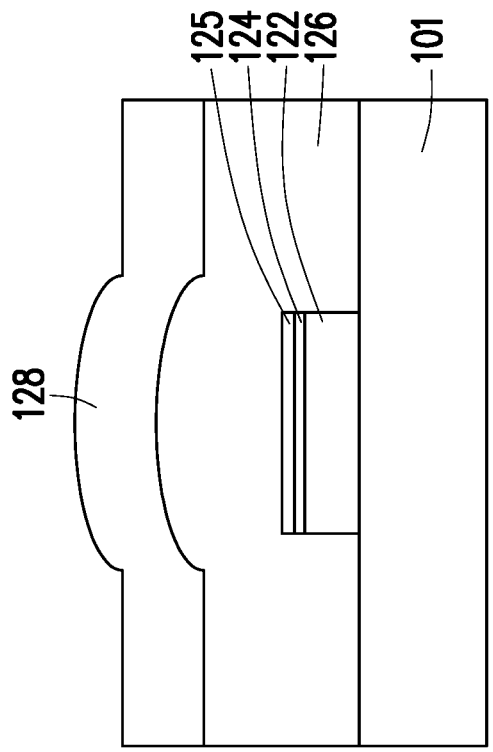
Figure 3E:
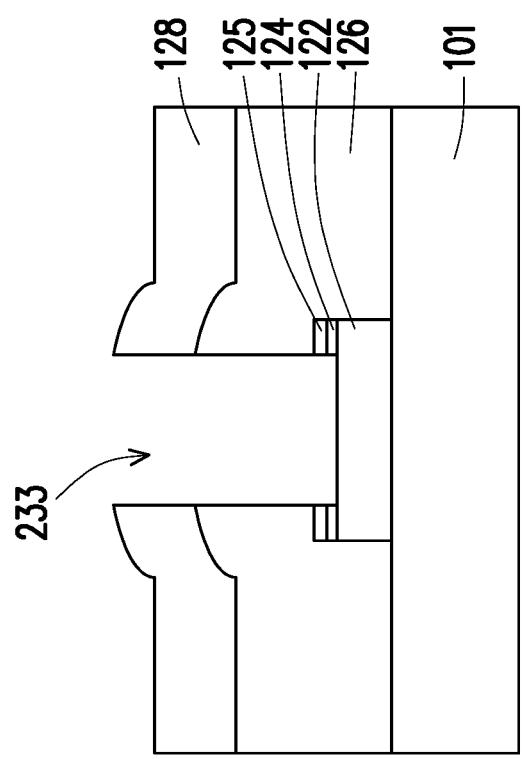
Figure 4A:
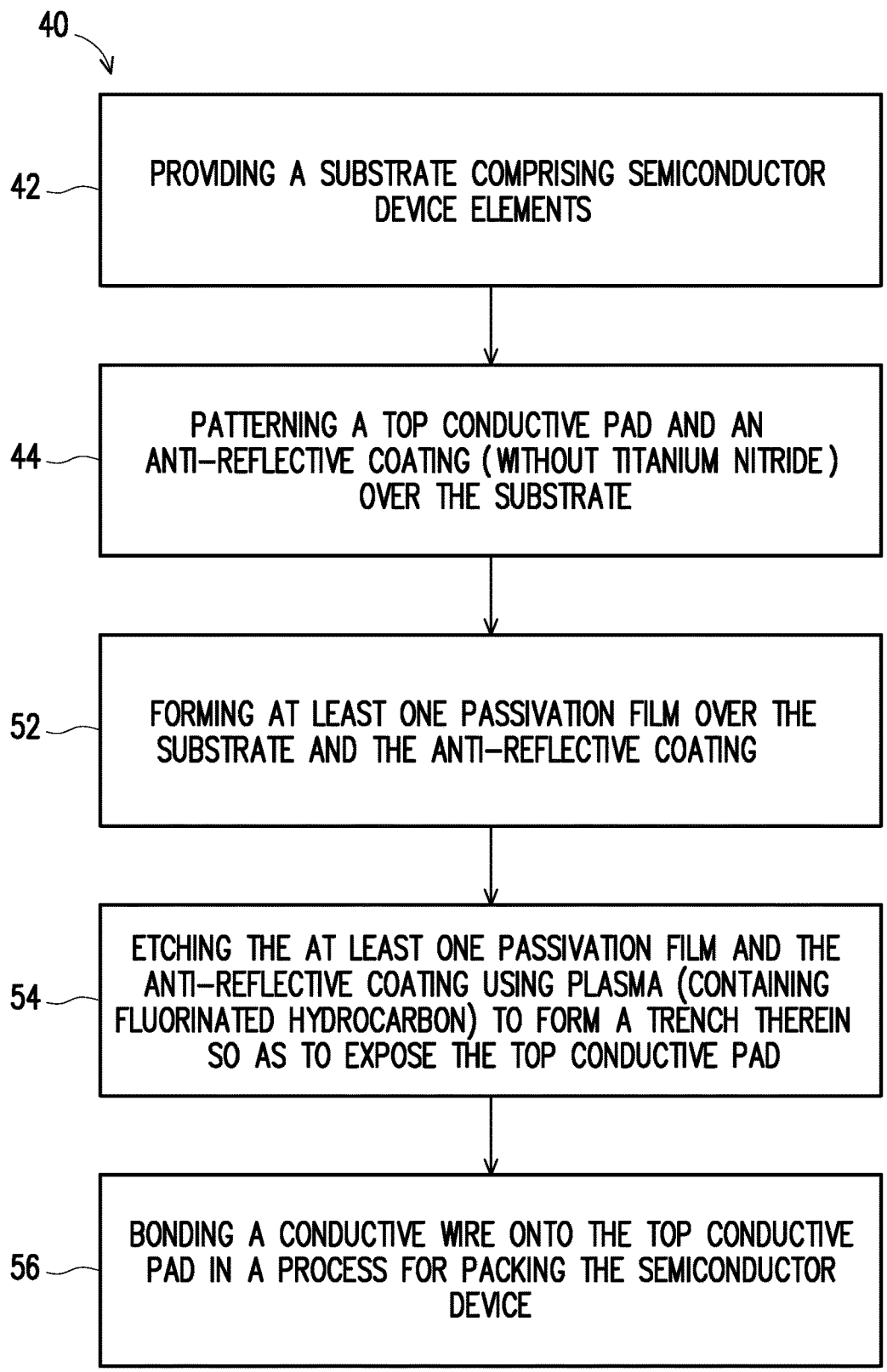
FIGS. 4A-4B are flow charts illustrating another method for forming a semiconductor device comprising a top conductive pad in accordance with some embodiments.
Figure 4B:
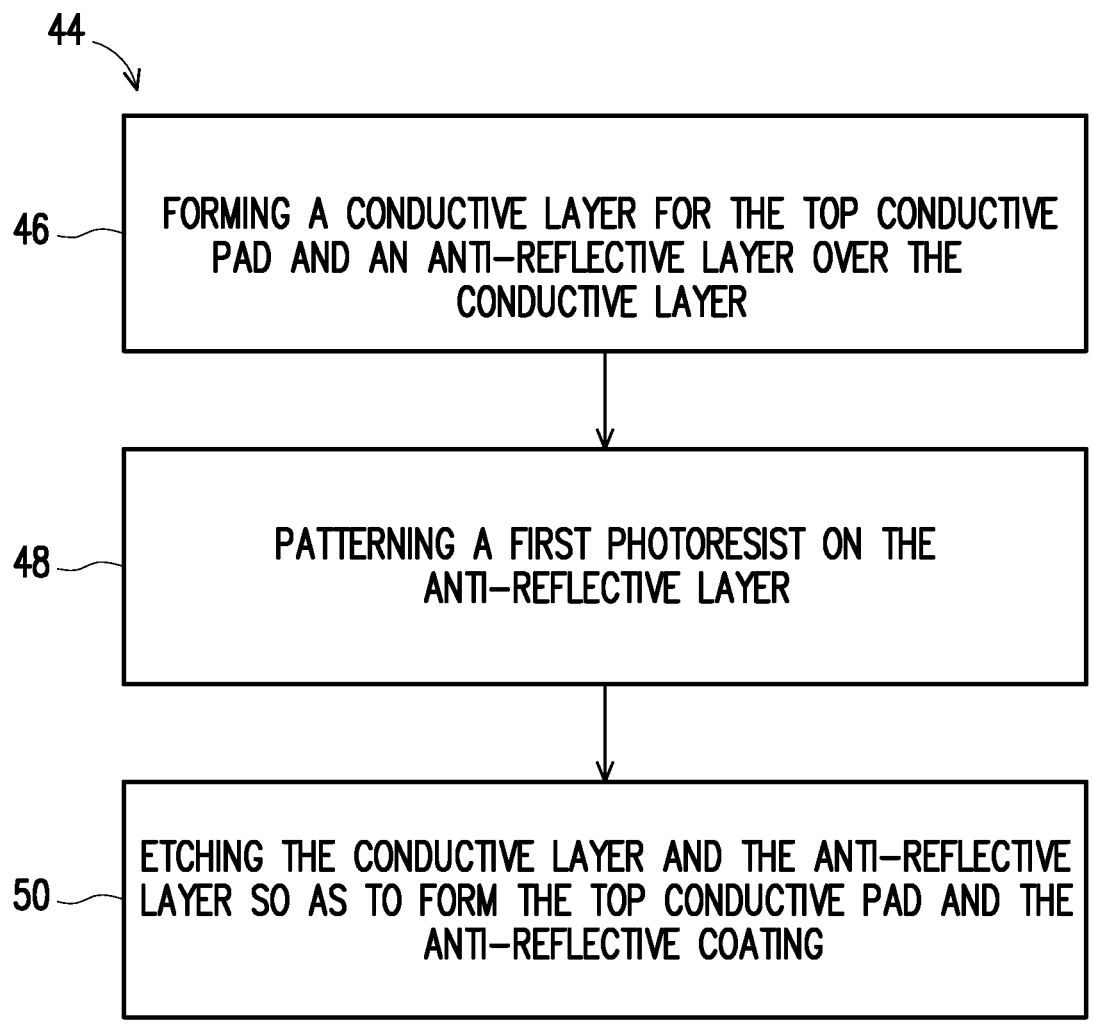

In FIGS. 1-2, 3A-3E, 4A-4B, and 5A-5E, like items are indicated by like reference numerals, and for brevity, descriptions of the structure, provided above with reference to the preceding figures, are not repeated. In at least one embodiment, the methods described in FIG. 2 and FIG. 4A-4B are described with reference to the structures described in FIGS. 3A-3E and FIGS. 5A-5E, respectively.

For brevity, unless expressly indicated otherwise, references to a "silicon oxynitride" made below will be understood to encompass a compound comprising silicon, oxygen, and nitrogen at any suitable ratio. A compound having a formula SiON is just one compound for illustration only. Such a compound may contain a small amount (e.g., <5 wt. %) of carbon and hydrogen in some embodiments. References to a "silicon nitride" made below will be understood to encompass a compound comprising silicon, and nitrogen at any suitable ratio, including but not limited to $Si_3N_4$. References to a "silicon oxide" made below will be understood to encompass a compound comprising silicon, and oxide at any suitable ratio, including but not limited to $SiO_2$.

Referring to FIG. 1, a semiconductor device 100 may be a CMOS device comprising a substrate 101 having semiconductor device elements, and a top layer 120. Unless expressly indicated otherwise, references to "a substrate comprising (or having) semiconductor device elements" made below will be understood to encompass a substrate on which a top conductive pad and passivation films are formed. As illustrated in FIG. 1, a substrate 101 may include semiconductor device elements such as transistors, interconnects, interlayer dielectrics, and other elements as described herein. In some embodiments, the semiconductor device 100 comprises a semiconductor wafer 102 as the base substrate, and transistors 103 disposed on the semiconductor wafer 102. The transistors 103 may be defined by channel regions 104, source/drain regions 106, and gate electrodes 110. The gate electrodes 110 are above the channel regions 104. A channel region 104 is beneath a respective gate electrode 110. The semiconductor device 100 also comprises interlayer dielectrics 112, 114. A plurality of metal interconnects 116, 118 are embedded in the interlayer dielectrics 112, 114, and are coupled to source or drain regions 106 over the semiconductor wafer 102. The plurality of metal interconnects 116, 118 may have multilayered interconnect structures. The plurality of metal interconnects 116, 118 also include metal vias extending vertically through a layered structure in a horizontal direction.

In some embodiments, the metal interconnects 116, 118 comprises a conductive material selected from copper (Cu), aluminum (Al), silver (Ag), gold (Au), tungsten (W), or alloys thereof. The conductive material comprises copper (Cu) or copper alloy in some embodiments. Such a conductive material can be formed by a process such as electric plating, chemical solution deposition, PVD (physical vapor deposition), CVD (chemical vapor deposition), ALD (atomic layer deposition) and PECVD (plasma enhanced chemical vapor deposition). For example, copper can be electroplated or sputtered in a vacuum chamber.

A top layer 120 in the semiconductor device 100 comprises a top conductive pad 122. The top conductive pad 122 comprises a suitable conductive material such as copper (Cu), aluminum (Al), silver (Ag), gold (Au), tungsten (W), or alloys thereof. In some embodiments, the top conductive pad 122 comprises Cu and Al, for example, AlCu, a copper alloy comprising a suitable amount of aluminum, or an aluminum alloy comprising a suitable amount of copper. The top conductive pad 122 can be formed by a process such as electric plating, chemical solution deposition, sputtering PVD, CVD, ALD and PECVD. The top conductive pad 122 is embedded inside one or more passivation layer 126, 128, but with one top surface exposed for wire bonding and device packaging. The present disclosure provides methods for forming the top layer 120 comprising a top conductive pad 122, and resulting devices.

Referring to FIG. 2 and FIGS. 3A-3E, a method 20 is provided in accordance with some embodiments.

At step 22 (FIG. 2), a substrate 101 comprising semiconductor device elements as described above is provided. The semiconductor device elements may include transistors 103 formed on a semiconductor wafer 102, and multilayered interconnect structures 116, 118 comprising vias 118 embedded inside one or more interlayer dielectric layers 112, 114. The transistor 103 may include channel regions 104, source/drain regions 106, and gate electrodes 110.

At step 24, a top conductive pad 122 and one or more anti-reflective coatings 124, 125 are patterned over the substrate 101. The anti-reflective coatings 124, 125 are disposed on the top conductive pad 122. A process for patterning the top conductive pad 122 and the one or more anti-reflective coatings 124, 125 are illustrated in FIGS. 3A-3B. The resulting device structure after step 24 is illustrated in FIG. 3B.

In some embodiments, the one or more anti-reflective coatings 124, 125 include two layers as shown in FIGS. 3A-3B. At least one of anti-reflective coatings 124, 125 comprises titanium nitride. Another anti-reflective coating may contain a different material such as silicon oxynitride. For example, a first anti-reflective coating 124 may comprise titanium nitride, and a second anti-reflective coating 125 disposed on the first anti-reflective coating 124 may comprise silicon oxynitride. In some embodiments, only one anti-reflective coating 124 or 125 comprising titanium nitride is used. Each of the anti-reflective coatings 124, 125 may have a thickness in a range of from about 50 Angstroms to about 500 Angstroms (e.g., 150-300 Angstroms).

The top conductive pad 122 and the one or more anti-reflective coatings 124, 125 may be patterned using suitable processes. For example, referring to FIG. 3A, in some embodiments, a layer for a top conductive pad 122 is formed over the substrate 101. The one or more anti-reflective coatings 124, 125 are coated onto the layer for the top conductive pad 122. A first photoresist 130 is patterned on the layer for the top conductive pad 122 and the one or more anti-reflective coatings 124, 125 as shown in FIG. 3A. The patterns of the first photoresist 130 are used to define the locations to be etched. The portions of the layer for the top conductive pad 122 and the one or more anti-reflective coatings 124, 125, which are not covered by the first photoresist 130, are etched. The desired patterns for the top conductive pad 122 and the one or more anti-reflective coatings 124, 125 are obtained after the photoresist 130 is removed. The resulting structure is illustrated in FIG. 3B.

At step 26, one or more passivation films 126, 128 are formed over the substrate 101 and the anti-reflective coatings 124, 125. The resulting structure is illustrated in FIG. 3C. Examples of a suitable material for the one or more passivation films 126, 128 include, but are not limited to, silicon dioxide, silicon nitride, silicon oxynitride, silicon carboxynitride, and any combination thereof. Such suitable material may or may not contain a small amount of hydrogen. In some embodiments, the one or more passivation films 126, 128 comprises two films including a first passivation film 126, and a second passivation film 128 disposed over the first passivation film 126. For example, the first passivation film 126 comprises silicon oxide, and the second passivation film 128 comprises silicon nitride in some embodiments.

At step 28, the one or more passivation films 126, 128 and the one or more anti-reflective coatings 124, 125 are etched to form a recess 233 (or trench) therein so as to expose the top conductive pad 122. An intermediate structure and a resulting structure after step 28 are illustrated in FIG. 3D and FIG. 3E, respectively. As shown in FIG. 3D, a layer of a second photoresist 230 is deposited over the one or more passivation films 126, 128, and then patterned to define a trench 231 inside the second photoresist 230 and above the top conductive pad 122. The portions of the one or more passivation films 126, 128 below the trench 231 are then etched. The one or more anti-reflective coatings 124, 125 above the top conductive pad 122 are also etched. The etching may be performed using a plasma comprising a fluorinated chemical species. For example, the plasma for etching the passivation films 126, 128 and the anti-reflective coatings 124 and 125 comprises a partially or fully fluorinated hydrocarbon, $SF_6$, or any combination thereof. The partially or fully fluorinated hydrocarbon may have a formula $CF_xH_y$, where x is in a range from 1 to 4, and y is in the range of from 0 to 3. Examples of a partially or fully fluorinated hydrocarbon include, but are not limited to, $CF_4$, $CHF_3$, $C_2F_6$, and $CH_2F_2$, and any combination thereof.

In some embodiments, at least one of the anti-reflective coatings 124 and 125 comprises titanium nitride. A plasma containing $SF_6$ is used accordingly. For example, when a first anti-reflective coating 124 may comprise titanium nitride, and a second anti-reflective coating 125 comprises silicon oxynitride, a plasma containing a flurorinated hydrocarbon is used to etch the second anti-reflective coating 125, and another plasma comprising $SF_6$ is used to etch the first anti-reflective coating 124.

However, the use of $SF_6$ in some embodiments generates some defects. First, the top conductive pad 122 may be slightly etched. With the plasma containing $SF_6$, the top conductive pad 122 may be accidently over-etched. Second, the use of $SF_6$ leaves fluorine residues on the surface of the top conductive pad 122 and then cause fluorination of the top conductive pad 122. As shown in the following schemes, the fluorine residue may react with moisture in the environment to generate HF, which can react with aluminum directly or aluminum oxide possibly existing on the surface of the top conductive pad 122.

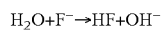

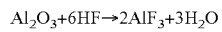

However, the presence of oxide and fluoride may negatively affect subsequently wire bonding and electrical connection. For better performance, the top conductive pad 122 should be essentially free of oxide and fluoride. Furthermore, further fluorination can corrode the top conductive pad 122 to cause loss of the top conductive pad 122. To avoid any fluorination of the top conductive pad 122, recipes of the plasma having less fluorine are desired.

Referring to FIGS. 4A-4B and FIGS. 5A-5E, a method 40 is provided in accordance with some other embodiments.

At step 42 of FIG. 4A, a substrate 101 comprising semiconductor device elements as described above is provided. Step 42 is the same as step 22 in some embodiments. The semiconductor device elements may include transistors 103 formed on a semiconductor wafer 102, and multilayered interconnect structures 116, 118 comprising vias 118 embedded inside one or more interlayer dielectric layers 112, 114.

Figure 5A:
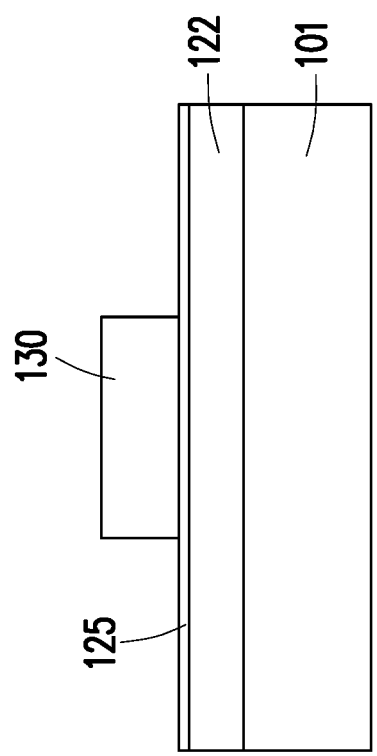
FIGS. 5A-5E are cross-sectional views of a portion of a device during fabrication in accordance with some embodiments.

At step 44, a top conductive pad 122 and an anti-reflective coating 125 are patterned over the substrate 101. The anti-reflective coating 125 is disposed on the top conductive pad 122. In some embodiments, the anti-reflective coating 125 does not comprise titanium nitride, but can comprise any other suitable materials such as silicon oxynitride. In some embodiments, the anti-reflective coating comprises or is made of silicon oxynitride. The anti-reflective coating may consist essentially of silicon oxynitride in some embodiments. In some embodiments, the anti-reflective coating 125 includes a single layer only as shown in FIG. 5A.

Figure 5C:
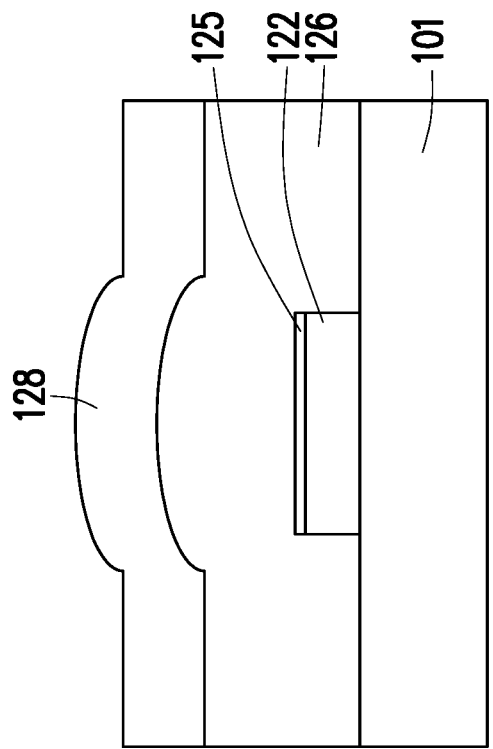
Figure 5B:
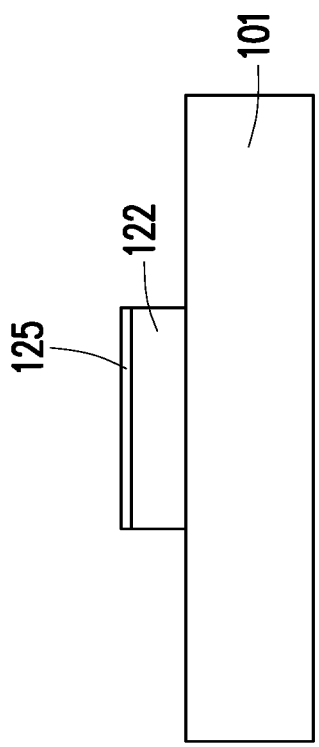

Referring to FIG. 4B, in some embodiments, the top conductive pad 122 and the anti-reflective coating 125 are patterned through steps 46, 48 and 50. At step 46, a layer for the top conductive pad 122 and an anti-reflective coating (or layer) 125 are formed over the substrate 101. At step 48, a first photoresist 130 is patterned on the anti-reflective coating 125 as illustrated in FIG. 5A. At step 50, the layer for the top conductive pad 122 and the anti-reflective coating 125 are etched so as to form the top conductive pad 122 and the anti-reflective coating 125. The patterns of the first photoresist 130 are used to define the locations to be etched. The patterns of the first photoresist 130 may protect the portions of the anti-reflective coating 125 and the top conductive pad 122 below the patterns of the first photoresist 130 from being etched. The portions of the layer for the top conductive pad 122 and the anti-reflective coating 125, which are not covered by the first photoresist 130, are etched. The desired patterns for the top conductive pad 122 and the anti-reflective coatings 125 are obtained after the photoresist 130 is removed. The resulting structure is illustrated in FIG. 5B. In some embodiments, the anti-reflective coatings 125 is a single layer only and is free of titanium nitride.

At step 52, one or more passivation films 126, 128 are formed over the substrate 101 and the anti-reflective coating 125. Step 52 is similar to or the same as step 26 as described. The resulting structure is illustrated in FIG. 5C. Examples of a suitable material for the one or more passivation films 126, 128 include, but are not limited to, silicon dioxide, silicon nitride, silicon oxynitride, silicon carboxynitride, and any combination thereof. Such suitable material may or may not contain a small amount of hydrogen. In some embodiments, the one or more passivation films 126, 128 comprises two films including a first passivation film 126, and a second passivation film 128 disposed over the first passivation film 126. For example, the first passivation film 126 comprises silicon oxide, and the second passivation film 128 comprises silicon nitride in some embodiments.

Figure 5D:
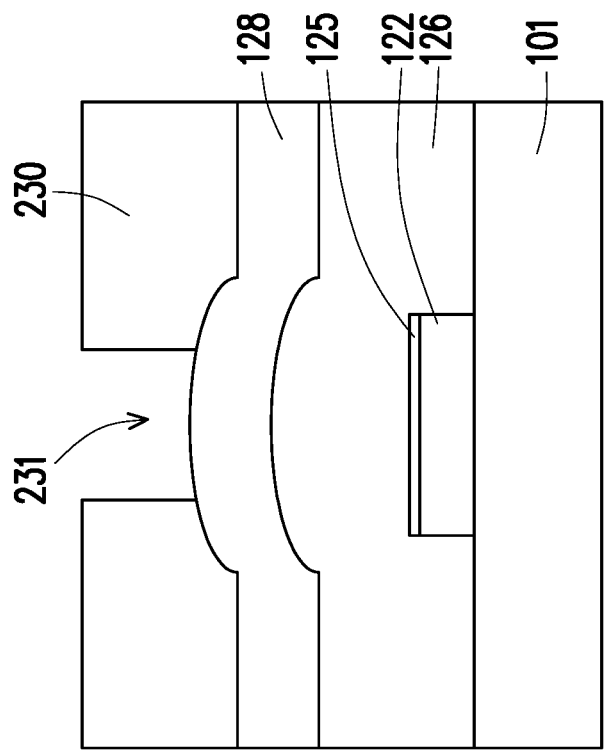
Figure 5E:
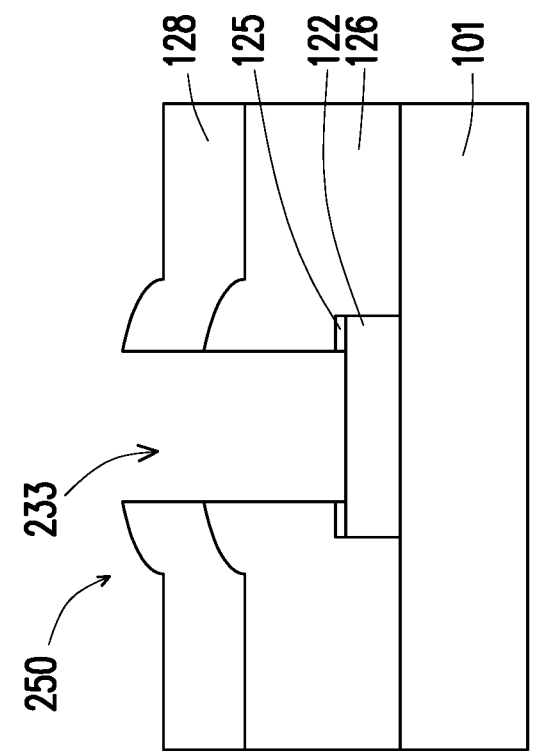

At step 54, the one or more passivation films 126, 128 and the anti-reflective coating 125 are etched to form a recess 233 therein so as to expose at least a portion of the top conductive pad 122 (or the top surface of the top conductive pad 122). An intermediate structure and a resulting structure after step 54 are illustrated in FIG. 5D and FIG. 5E, respectively. As shown in FIG. 5D, a layer of a second photoresist 230 is deposited over the one or more passivation films 126, 128, and then patterned to define a trench 231 inside the second photoresist 230 and above the top conductive pad 122. The portions of the one or more passivation films 126, 128 below the trench 231 are then etched. The anti-reflective coating 125 above the top conductive pad 122 is also etched.

In some embodiments, the one or more passivation films 126, 128 and the anti-reflective coating 125 are etched using plasma containing a fluorine-containing species other than $SF_6$. In some embodiments, the at least one passivation film 126, 128 and the anti-reflective coating 125 are etched using a plasma containing a partially or fully fluorinated hydrocarbon. It is preferable that the anti-reflective coating 125 contain no titanium nitride. In the step of etching the passivation films 126, 128 and the anti-reflective coating 125, such etching is performed using plasma containing no $SF_6$. The plasma comprises a partially or fully fluorinated hydrocarbon as the only fluorine-containing species in some embodiments. The partially or fully fluorinated hydrocarbon may have a formula $CF_xH_y$, where x is in a range from 1 to 4, and y is in the range of from 0 to 3. Examples of a partially or fully fluorinated hydrocarbon include, but are not limited to, $CF_4$, $CHF_3$, $C_2F_6$, and $CH_2F_2$, and any combination thereof. The use of $SF_6$ can cause fluorination of the top conductive pad 122. The use of fluorinated hydrocarbon prevents fluorination of the top conductive pad 122. In some embodiments, the fluorinated hydrocarbon is fully fluorinated, for example, $CF_4$ and $C_2F_6$. In some embodiments, the fluorinated hydrocarbon is partially fluorinated and contains hydrogen. Examples of such a partially fluorinated hydrogen may include, but is not limited to, $CHF_3$ and $CH_2F_2$.

In some embodiments, the top conductive pad 122 comprises aluminum and copper, for example, an alloy comprising aluminum and copper at a suitable ratio. After step 54, the exposed top conductive pad 122 is made of metal, essentially free of any oxide or fluoride on the surface. The top conductive pad 122 has any suitable thickness. In some embodiments, the top conductive pad 122 has a thickness in a range from about 4,000 Angstroms (Å) to about 40,000 Angstroms. For example, such a thickness may be in a range from 4,000 Å to 9,000 Å, from 10,000 Å to 40,000 Å, from 15,000 Å to 20,000 Å, from 20,000 Å to 30,000 Å, from 30,000 Å to 40,000 Å, or any other suitable range. In some embodiments, the top conductive pad 122 may have a thickness in a range of from about 10,000 Angstroms to 40,000 Angstroms. In some embodiments, the top conductive pad 122 comprises at least one of aluminum and copper, such as AlCu.

The method 40 including steps 42, 44, 52 and 54 provides the top conductive pad 122 free of oxide or fluoride on the surface and having high electrical conductivity and bondability. In addition, the method 40 helps to decrease the loss in the top conductive pad 122 resulting from plasma etching and subsequent fluorination as described above. For example, in one experiment, when the method 20 was used, an anti-reflective coating included titanium nitride, and plasma containing $SF_6$ was used, the loss in the top conductive pad 122 was greater than 5% based on the thickness of the top conductive pad 122. In comparison, in another experiment, the method 40 was used. In at least one embodiment, the first anti-reflective coating 124 is free of titanium nitride. The reflective coating 125 consisted essentially of silicon oxynitride (SiON), a plasma consisting essentially of fluorinated hydrocarbon without $SF_6$ was used for etching the passivation films 126, 128 and the anti-reflective coating 125 (step 54). The resulting loss in the top conductive pad 122 comprising AlCu was in the range of from about zero percent to about 2.9% in thickness. For example, such a loss of AlCu was less than 1%, less than 0.5%, or less than 0.1%. Compared to the other approach when the plasma containing $SF_6$ was used, method 40 helps to prevent significant loss of the top conductive pad 122.

Further, in some embodiments, the anti-reflective coating 124 is free of titanium nitride, so the etching rate and the manufacturing efficiency have also improved. For example, in some experiments with the method 40 without using $SF_6$, compared to the experiment with the method 20, the number of wafer per hour (WPH) etched increased by a percentage in the range of from 9% to 15%.

At step 56, a conductive wire is bonded onto the top conductive pad 122 in a process for packaging the semiconductor device after the top conductive pad 122 is exposed. Optionally, a metal may be deposited into the recess 233 in the device packaging processes.

The present disclosure provides a semiconductor device 250 as illustrated in FIG. 5E. Such a semiconductor device 250 comprises a substrate 101 comprising semiconductor device elements, and a top conductive pad 122 and an anti-reflective coating 125 in a pattern formed over the substrate 101. The anti-reflective coating 125 is disposed on the top conductive pad 122 and partially covers the top conductive pad 122. The semiconductor device 250 further comprises at least one passivation film 126, 128 formed over the substrate 101 and the anti-reflective coating 125. The at least one passivation film 126, 128 comprises a first passivation film 126 and a second passivation film 128 disposed on the first passivation film 126 as described above. A recess 233 is defined by and within the at least one passivation film 126, 128 and the anti-reflective coating 125 so as to expose the top conductive pad 122.

In some embodiments, the anti-reflective coating 125 includes a single layer disposed or buried between the passivation film 126 and the top conductive pad 122 (FIG. 5E). In some embodiments, the top conductive pad 122 exposed in the trench 233 or the whole portion of the top conductive pad 122 includes aluminum, copper, or both aluminum and copper, and is free of any fluoride such as aluminum fluoride ($AlF_3$).

The present disclosure provides a method for manufacturing a semiconductor device. In some embodiments, such a method comprises steps of providing a substrate comprising semiconductor device elements, and patterning a top conductive pad and an anti-reflective coating over the substrate. The semiconductor device elements may include transistors formed on a semiconductor wafer, and multilayered interconnect structures comprising vias embedded inside one or more interlayer dielectric layers. The anti-reflective coating is disposed on the top conductive pad. The method further comprises steps of forming at least one passivation film over the substrate and the anti-reflective coating, and etching the at least one passivation film and the anti-reflective coating to form a recess therein so as to expose at least one portion of the top conductive pad.

In some embodiments, the top conductive pad and the anti-reflective coating are patterned through the following steps. These include forming a conductive layer for the top conductive pad and an anti-reflective layer over the substrate, patterning a first photoresist on the anti-reflective layer, and etching the conductive layer and the anti-reflective layer so as to form the top conductive pad and the anti-reflective coating.

In some embodiments, the anti-reflective coating comprises silicon oxynitride. The anti-reflective coating may consist essentially of silicon oxynitride in some embodiments. In some embodiments, the at least one passivation film comprises two films including a first passivation film, and a second passivation film disposed over the first passivation film. For example, the first passivation film comprises silicon oxide, and the second passivation film comprises silicon nitride in some embodiments.

In some embodiments, the at least one passivation film and the anti-reflective coating are etched using a plasma containing a partially or fully fluorinated hydrocarbon. The anti-reflective coating may contain titanium nitride in some embodiments. However, it is preferable that the anti-reflective coating may contain no titanium nitride. In the step of etching the at least one passivation film and the anti-reflective coating, such etching is using a plasma containing no $SF_6$.

In some embodiments, the top conductive pad comprises aluminum and copper, for example, an alloy comprising aluminum and copper at a suitable ratio. After exposed, the conductive pad is made of metal, essentially free of any oxide or fluoride on the surface. The method further comprises bonding a conductive wire onto the top conductive pad in a process for packaging the semiconductor device after the top conductive pad is exposed.

In some embodiments, the present disclosure provides a method for manufacturing a semiconductor device. Such a method comprises the following steps: providing a substrate comprising semiconductor device elements, and patterning a top conductive pad and an anti-reflective coating over the substrate. The anti-reflective coating is disposed on the top conductive pad and comprising silicon oxynitride. The method further comprises steps of forming at least one passivation film over the substrate and the anti-reflective coating, and etching the at least one passivation film and the anti-reflective coating using a plasma to form a recess therein so as to expose at least one portion of the top conductive pad. The plasma comprises a partially or fully fluorinated hydrocarbon. The at least one passivation film may comprise a first passivation film, and a second passivation film disposed on the first passivation film. For example, the first passivation film comprises silicon oxide, and the second passivation film comprises silicon nitride in some embodiments. The partially or fully fluorinated hydrocarbon may have a formula $CF_xH_y$, where x is in a range from 1 to 4, and y is in the range of from 0 to 3. The top conductive pad may have a thickness in a range from about 4,000 Angstroms (Å) to about 40,000 Angstroms, for example, in a range from 4,000 Å to 9,000 Å, from 10,000 Å to 40,000 Å, from 15,000 Å to 20,000 Å, from 20,000 Å to 30,000 Å, from 30,000 Å to 40,000 Å, or any other suitable range. The top conductive pad may comprise aluminum and copper such as AlCu.

In some embodiments, the present discloses provides a method for manufacturing a semiconductor device. The method comprises the steps of providing a substrate comprising semiconductor device elements, forming a conductive layer and an anti-reflective layer over the substrate, patterning a first photoresist on the anti-reflective layer, and etching the conductive layer and the anti-reflective layer so as to form a top conductive pad and an anti-reflective coating in a pattern over the substrate. The method further comprises forming at least one passivation film over the substrate and the anti-reflective coating. The at least one passivation film comprises a first passivation film and a second passivation film disposed on the first passivation film. The method further comprises etching the at least one passivation film and the anti-reflective coating using a plasma to form a recess therein so as to expose the top conductive pad. In some embodiments, the anti-reflective coating consists essentially of silicon oxynitride. In the step of etching the at least one passivation film and the anti-reflective coating, the plasma consists essentially of a partially or fully fluorinated hydrocarbon in some embodiments. The partially or fully fluorinated hydrocarbon has a formula $CF_xH_y$, where x is in a range from 1 to 4, and y is in the range of from 0 to 3. The top conductive pad may comprise aluminum and copper, and may have a thickness in a range of from about 10,000 Angstroms to 40,000 Angstroms.

In another aspect, the present disclosure provides a semiconductor device. Such a semiconductor device comprises a substrate comprising semiconductor device elements, and a top conductive pad and an anti-reflective coating in a pattern formed over the substrate. The anti-reflective coating is disposed on and partially covers the top conductive pad. The semiconductor device further comprises at least one passivation film formed over the substrate and the anti-reflective coating. The at least one passivation film comprises a first passivation film and a second passivation film disposed on the first passivation film. A recess is defined by and within the at least one passivation film and the anti-reflective coating so as to expose the top conductive pad.

The semiconductor device elements include transistors formed on a semiconductor wafer, and multilayered interconnect structures comprising vias embedded inside one or more interlayer dielectric layers. In some embodiments, the anti-reflective coating consists essentially of silicon oxynitride. The first passivation film comprises silicon oxide, and the second passivation film comprises silicon nitride. The top conductive pad comprises aluminum and copper, and has a thickness in a range of from about 10,000 Angstroms to 40,000 Angstroms. In some embodiments, the anti-reflective coating is a single layer disposed between the at least one passivation film and the top conductive pad. In some embodiments, the top conductive pad exposed in the trench includes aluminum, copper, or both aluminum and copper, and is free of any fluoride such as aluminum fluoride ($AlF_3$).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   providing a substrate comprising semiconductor device elements;
   patterning a top conductive pad and an anti-reflective coating over the substrate using a first photoresist, the anti-reflective coating disposed on the top conductive pad, wherein the anti-reflective coating contains no titanium nitride, and is an only layer disposed between the top conductive pad and the first photoresist before the first photoresist is removed;
   forming at least one passivation film over the substrate and the anti-reflective coating; and
   etching the at least one passivation film and the anti-reflective coating using a plasma containing no $SF_6$ and containing a partially fluorinated hydrocarbon as the only flourine-containing species to form a recess therein so as to expose the top conductive pad, wherein the top conductive pad is free of fluoride and oxide when exposed, wherein the at least one passivation film and the anti-reflective coating define a side wall of the recess and are exposed in the recess, and the top conductive pad is configured to be bonded with a conductive wire or accept a metal deposited thereon.

2. The method of claim 1, wherein the semiconductor device elements include transistors formed on a semiconductor wafer, and multilayered interconnect structures comprising vias embedded inside one or more interlayer dielectric layers.

3. The method of claim 1, wherein the patterning the top conductive pad and the anti-reflective coating comprises:
   forming a conductive layer for the top conductive pad and an anti-reflective layer over the substrate;
   patterning the first photoresist on the anti-reflective layer; and etching the conductive layer and the anti-reflective layer so as to pattern the top conductive pad and the anti-reflective coating.

4. The method of claim 1, wherein the anti-reflective coating comprises silicon oxynitride.

5. The method of claim 1, wherein the at least one passivation film comprises a first passivation film, and a second passivation film disposed over the first passivation film.

6. The method of claim 5, wherein the first passivation film comprises silicon oxide, and the second passivation film comprises silicon nitride.

7. The method of claim 1, wherein the top conductive pad comprises aluminum and copper.

8. The method of claim 1, further comprising:
bonding a conductive wire onto the top conductive pad in a process for packaging the semiconductor device after the top conductive pad is exposed.

9. A method for manufacturing a semiconductor device, comprising:
providing a substrate comprising semiconductor device elements;
patterning a top conductive pad and an anti-reflective coating over the substrate using a first photoresist, the anti-reflective coating disposed on the top conductive pad and comprising silicon oxynitride, wherein the anti-reflective coating contains no titanium nitride, and is an only layer disposed between the top conductive pad and the first photoresist before the first photoresist is removed;
forming at least one passivation film over the substrate and the anti-reflective coating; and
etching the at least one passivation film and the anti-reflective coating using a plasma to form a recess therein so as to expose the top conductive pad, the plasma comprising a partially or fully fluorinated hydrocarbon as the only flourine-containing species, wherein the top conductive pad is free of fluoride and oxide when exposed,
wherein the at least one passivation film and the anti-reflective coating define a side wall of the recess and are exposed in the recess, and the top conductive pad is configured to be bonded with a conductive wire or accept a metal deposited thereon.

10. The method of claim 9, wherein the partially or fully fluorinated hydrocarbon has a formula $CF_xH_y$, where x is in a range from 1 to 4, and y is in the range of from 0 to 3.

11. The method of claim 9, wherein the top conductive pad has a thickness in a range from about 4,000 Angstroms to about 40,000 Angstroms.

12. The method of claim 9, where the top conductive pad comprises AlCu.

13. A method for manufacturing a semiconductor device, comprising steps of:
providing a substrate comprising semiconductor device elements;
patterning a top conductive pad and an anti-reflective coating over the substrate using a first photoresist, the anti-reflective coating disposed on the top conductive pad, wherein the anti-reflective coating includes no titanium nitride, has a thickness in a range of from about 50 Angstroms to about 500 Angstroms, and is an only layer disposed between the top conductive pad and the first photoresist before the first photoresist is removed;
forming at least one passivation film over the substrate and the anti-reflective coating; and
etching the at least one passivation film and the anti-reflective coating using a plasma to form a recess therein so as to expose the top conductive pad, the plasma comprising a partially or fully fluorinated hydrocarbon as the only fluorine-containing species, wherein the top conductive pad is free of fluoride and oxide when exposed,
wherein the at least one passivation film and the anti-reflective coating define a side wall of the recess and are exposed in the recess, and the top conductive pad is configured to be bonded with a conductive wire or accept a metal deposited thereon.

14. The method of claim 13, wherein the step of patterning the top conductive pad and the anti-reflective coating comprises:
forming a conductive layer for the top conductive pad and an anti-reflective layer over the substrate;
patterning the first photoresist on the anti-reflective layer; and
etching the conductive layer and the anti-reflective layer so as to pattern the top conductive pad and the anti-reflective coating.

15. The method of claim 13, wherein the anti-reflective coating consisting essentially of silicon oxynitride.

16. The method of claim 13, wherein the recess has an opening smaller than a dimension of the anti-reflective coating parallel to the substrate, and the anti-reflective coating has a portion embedded between the at least one passivation film and the top conductive pad after the recess is formed.

17. The method of claim 13, wherein the plasma contains no $SF_6$.

18. The method of claim 13, wherein the partially or fully fluorinated hydrocarbon is $CH_2F_2$ or $C_2F_6$.

19. The method of claim 13, where the top conductive pad comprises AlCu.

* * * * *